US008841157B2

(12) United States Patent
Rekow

(10) Patent No.: US 8,841,157 B2
(45) Date of Patent: Sep. 23, 2014

(54) METHOD AND STRUCTURE FOR USING DISCONTINUOUS LASER SCRIBE LINES

(75) Inventor: Matthew Rekow, Santa Cruz, CA (US)

(73) Assignee: Esi-Pyrophotonics Lasers Inc, Quebec (CA)

( * ) Notice: Subject to any disclaimer, the term of this patent is extended or adjusted under 35 U.S.C. 154(b) by 168 days.

(21) Appl. No.: 13/343,546

(22) Filed: Jan. 4, 2012

(65) Prior Publication Data

US 2013/0168797 A1 Jul. 4, 2013

(51) Int. Cl.
*H01L 21/00* (2006.01)
*H01L 31/0224* (2006.01)
*H01L 27/142* (2014.01)
*H01L 21/42* (2006.01)

(52) U.S. Cl.
CPC .... *H01L 31/022425* (2013.01); *H01L 27/1423* (2013.01); *H01L 27/1425* (2013.01); *H01L 31/022458* (2013.01); *H01L 21/42* (2013.01)
USPC ......... 438/57; 438/98; 438/669; 257/E31.124

(58) Field of Classification Search
CPC .............. H01L 31/022425; H01L 31/002433; H01L 31/02245; H01L 31/022458; H01L 21/42; H01L 27/1425; H01L 27/1423
USPC ......... 438/57, 96, 97, 98, 676, 669; 257/E31, 257/124, E31.124
See application file for complete search history.

(56) References Cited

U.S. PATENT DOCUMENTS 5,593,901 A   1/1997  Oswald et al.
7,428,253 B2  9/2008  Murison et al.
7,679,005 B2 * 3/2010  Chan et al. .................. 174/262
7,742,511 B2  6/2010  Murison et al.
7,829,356 B2 * 11/2010 Mei et al. ......................... 438/17
7,998,838 B2  8/2011  Rekow et al.
2003/0180983 A1 * 9/2003 Oswald et al. .................. 438/57
2010/0078064 A1 * 4/2010 Coakley ......................... 136/246
2011/0129958 A1  6/2011  Rekow et al.
2011/0132448 A1 * 6/2011 Payne et al. .................. 136/256

FOREIGN PATENT DOCUMENTS

WO   WO9721253 A1   6/1997

OTHER PUBLICATIONS

International Search Report of PCT/US2012/067718, 2 pages, Mar. 28, 2013.
Written Opinion of PCT/US2012/067718, 5 pages.

* cited by examiner

*Primary Examiner* — Michael Trinh
(74) *Attorney, Agent, or Firm* — Haynes Beffel & Wolfeld LLP

(57) ABSTRACT

A thin film photovoltaic device includes a substrate and a first conductive layer coupled to the substrate. The first conductive layer includes at least one first groove extending through a first portion of the first conductive layer to a portion of the substrate. The device also includes at least one semiconductor layer coupled to a remaining portion of the first conductive layer and the portion of the substrate. The at least one semiconductor layer includes a plurality of non-overlapping vias, each via extending through a portion of the at least one semiconductor layer to a portion of the first conductive layer. The device further includes a second conductive layer coupled to a remaining portion of the at least one semiconductor layer and portions of the first conductive layer. The second conductive layer includes at least one second groove extending through a portion of the second conductive layer to a portion of the at least one semiconductor layer.

7 Claims, 10 Drawing Sheets

METHOD AND STRUCTURE FOR USING DISCONTINUOUS LASER SCRIBE LINES

BACKGROUND OF THE INVENTION

Copper indium gallium diselenide (CIGS) has become a popular material for the production of thin film photovoltaic (PV) panels. CIGS now holds the world record of 20.1% efficiency for thin film single junction cell efficiency. With any new material comes new challenges, and CIGS has been no exception. While laser scribing has long been the process of choice to form amorphous-silicon (a-Si) and cadmium telluride (CdTe) monolithic interconnects, typically referred to as the P1, P2 and P3 scribe processes, CIGS has presented difficulties in relation to laser processing for the P2 and P3 steps. Thermal effects, giving rise to an increase in electrical conductivity of the film in the laser processed areas, are detrimental to the PV cell electrical performance. Even picosecond laser process results are not completely free of this detrimental heat effect as evidenced by the melted edges and residue. It has been shown that a narrow process window exists in the low nanosecond regime within which a CIGS film can be scribed with virtually no heat effect. Even utilizing the pulse tailoring capabilities of programmable fiber lasers, P2 and P3 scribes in CMS often fail to produce satisfactory results.

Therefore, there is a need in the art for improved methods and systems related to laser scribing of CIGS and other PV materials.

SUMMARY OF THE INVENTION

The present invention relates generally to laser processing systems. More specifically, the present invention relates to methods and systems for fabricating thin film PV modules. Merely by way of example, the invention has been applied to methods and systems for laser scribing the P2 and P3 scribes using non-overlapping vias for the P2 scribe and a P3 scribe that terminates at the interface between the semiconductor layer and the top conductor layer. The methods and systems can be applied to a variety of other laser processing applications including scribing processes for other electronic, optical, and optoelectronic devices.

According to an embodiment of the present invention, a method of forming a thin film photovoltaic module is provided. The method includes providing a substrate having a first surface and a second surface opposing the first surface. The substrate has a first conductive layer coupled to the first surface. The method also includes removing a portion of the first conductive layer to expose a portion of the first surface and forming at least one semiconductor layer coupled to remaining portions of the first conductive layer and the portion of the first surface. The method further includes removing, using laser energy, a first portion of the at least one semiconductor layer to form a plurality of non-overlapping vias extending through the removed first portion of the at least one semiconductor layer to the first conductive layer, forming a second conductive layer coupled to a remaining portion of the at least one semiconductor layer and portions of the first conductive layer exposed by the plurality of vias, and removing, using laser energy, a portion of the second conductive layer to expose a second portion of the at least one semiconductor layer.

According to another embodiment of the present invention, a laser-based processing method of scribing a pattern in a thin film structure disposed on a substrate is provided. The thin film structure includes a first conductive layer coupled to the substrate, at least one semiconductor layer coupled to the first conductive layer, and a second conductive layer coupled to the at least one semiconductor layer. The method includes directing a series of laser pulses to impinge on the thin film structure. The series of laser pulses is characterized by a photon energy greater than a band gap energy associated with at least one layer of the at least one semiconductor layer. The method also includes removing, using the energy of the series of laser pulses, a portion of the second conductive layer to form at least one continuous groove extending from a first surface of the second conductive layer to the at least one semiconductor layer.

According to an alternative embodiment of the present invention, a thin film photovoltaic device is provided. The thin film photovoltaic device includes a substrate having a first surface and a second surface opposing the first surface and a first conductive layer coupled to the first surface of the substrate. The first conductive layer includes at least one first groove extending through a first portion of the first conductive layer to a portion of the first surface of the substrate. The thin film photovoltaic device also includes at least one semiconductor layer coupled to a remaining portion of the first conductive layer and the portion of the first surface of the substrate. The at least one semiconductor layer includes a plurality of non-overlapping vias, each via extending through a portion of the at least one semiconductor layer to a portion of the first conductive layer. The thin film photovoltaic device further includes a second conductive layer coupled to a remaining portion of the at least one semiconductor layer and portions of the first conductive layer. The second conductive layer includes at least one second groove extending through a portion of the second conductive layer to a portion of the at least one semiconductor layer.

Numerous benefits are achieved by way of the present invention over conventional techniques. For example, embodiments of the present invention provide laser-based methods of forming discontinuous P2 scribes in thin film PV modules that achieve one or more of the following benefits: (1) substantially clean removal of the semiconductor material with minimal residue in each non-overlapping via, and (2) reduced or minimal thermal damage to the wall of each via and to adjacent areas in the semiconductor layer. Embodiment of the present invention also provide laser-based methods of forming continuous P3 scribes in thin film PV modules which achieve one or more of the following benefits: (1) substantially clean removal of the back conductive material with minimal residue in the scribed groove, (2) preservation of the native semiconductor surface at the bottom of the scribed groove, and (3) improved or optimized scribe resistance comparable to that of mechanical scribes.

These and other embodiments of the invention along with many of its advantages and features are described in more detail in conjunction with the text below and attached figures.

DETAILED DESCRIPTION OF SPECIFIC EMBODIMENTS

Embodiments of the present invention relate to laser processing systems. More specifically, the present invention relates to methods and systems for fabricating thin film PV modules. Merely by way of example, the invention has been applied to methods and systems for P2 and P3 laser scribing processes using non-overlapping vias for a P2 scribe and a continuous P3 scribe that terminates at the semiconductor/conductor interface. The methods and systems can be applied to a variety of other laser processing applications including scribing processes for other electronic, optical, and optoelectronic devices.

Figure 1A:
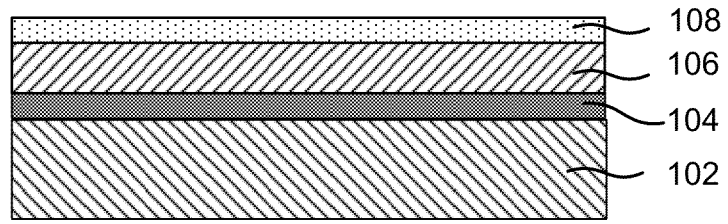
FIGS. 1A-1C are simplified schematic cross-sectional diagrams illustrating a P2 or P3 laser scribing process.
Figure 1B:
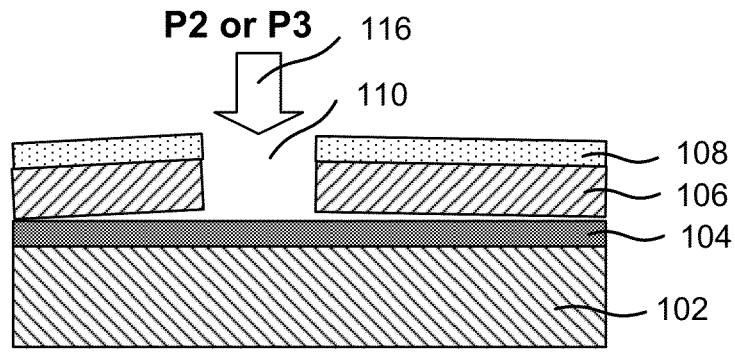
Figure 1C:
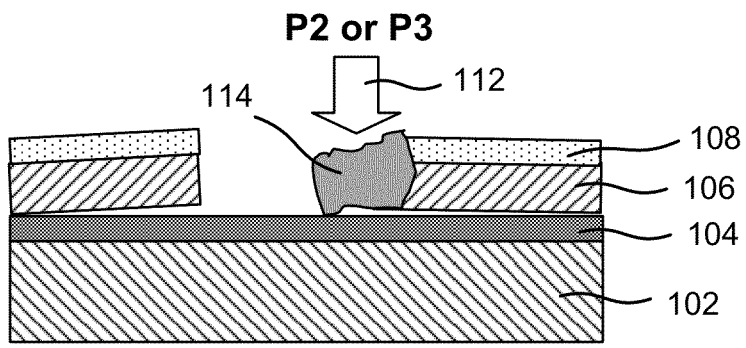

FIGS. 1A-1C are simplified schematic cross-sectional diagrams illustrating a P2 or P3 laser scribing process as used in fabricating a thin film PV device or other types of devices. As shown in FIG. 1A, in a typical thin film PV module, a first conductive layer 104 is formed on a substrate 102. A semiconductor layer 106 is then formed on the first conductive layer 104. Next, a second conductive layer 108 is formed on the semiconductor layer 106. Each of the first conductive layer 104, the semiconductor layer 106, and the second conductive layer 108 may be formed by physical vapor deposition (PVD), chemical vapor deposition (CVD), sputtering, or other thin film deposition techniques as well known in the art. The substrate 102 may comprise silicon, silicon dioxide, aluminum oxide, sapphire, germanium, gallium arsenide (GaAs), an alloy of silicon and germanium, indium phosphide (InP), glass, plastic, combinations thereof, or the like. Each of the first conductive layer 104 and the second conductive layer 108 may comprise a metal, such as Mo, Ti, Ni, Al, Au, Cr, Ag, combinations thereof, or the like. The first conductive layer 104 may also comprise a transparent conducting oxide (TCO), such as ZnO, $SnO_2$, ITO, ATO, AZO, CIO, CZO, GZO, FTO, combinations thereof, or the like. The semiconductor layer 106 may comprise amorphous silicon (a-Si), micro-crystalline silicon (μc-Si), cadmium telluride (CdTe), copper indium diselenide, copper indium gallium diselenide (CIGS), combinations thereof, or the like. According to various embodiments, the semiconductor layer 104 may comprise a single layer of a semiconductor material to form a single junction PV device, or multiple layers of differing semiconductor materials to form a multiple junction PV device.

To form a monolithic serially-connected thin film PV module, the first conductive layer 104 is scribed (P1, not shown in FIG. 1) to separate the first conductive layer 104 into a plurality of cells. The semiconductor layer 106 is scribed (P2) to provide electrical passage ways between a second conductive layer 108 in one cell to a first conductive layer 104 in an adjacent cell. A final scribe (P3) is performed after the second conductive layer is formed to separate the cells. Each of P1-P3 may be performed by mechanical scribing or laser scribing. Mechanical scribing has the disadvantage that it tends to produce chip outs and is associated with relatively high maintenance cost, as scribing needles need to be cleaned and replaced regularly. Therefore laser scribing has been the preferred scribing method for some materials. Traditionally, Q-switched pulsed laser sources, such as Nd:YAG lasers, have been used for laser scribing. However, the typical slow rise time and fall time characteristics of Q-switched lasers gives rise to thermal effects that are detrimental to the PV cell electrical performance.

In contrast, as described in U.S. Pat. No. 7,998,838, the disclosure of which is hereby incorporated by reference, a series of laser pulses produced by a fiber laser with tailored pulse shapes can produce superior P2 and P3 scribe lines in CIGS thin film PV modules with minimal or no residue in the groove, minimal or no damage to the walls of the groove or adjacent area, minimal or no damage to the underlying conductive layer. It is understood, without limiting embodiments of the present invention, that such superior scribing results are achieved by a brittle fracture process. In this process, the energy of a laser pulse is absorbed at the interface between the first conductive layer 104 and the semiconductor layer 106, causing heat to be built up at the interface. The heat in turn causes the selenium in CIGS to vaporize. The selenium vapor pressure then pushes off the overlying CIGS material as more or less solid fragments.

However, even such laser scribing processes using tailored pulse shapes may fail to produce satisfactory continuous P2 and P3 scribe lines in CIGS. This failure may be understood as a result of delamination of the CIGS layer created by a previous laser pulse. As shown in FIG. 1B, as a first laser pulse 116 creates a first via 110 in the CIGS layer, it also lifts off part of CIGS layer adjacent to the first via 110. As shown in FIG. 1C, as a second laser pulse 112 is directed to an area of the CIGS layer that has been lifted off. Consequently, selenium vapor expands into a larger volume compared to the case without delamination. Accordingly, the selenium vapor pressure is reduced such that it is insufficient to blow off the overlying layers. As a result, the region 114 of the CIGS layer melts instead of being blown off into solid fragments as in a brittle fracture process.

Figure 1D:
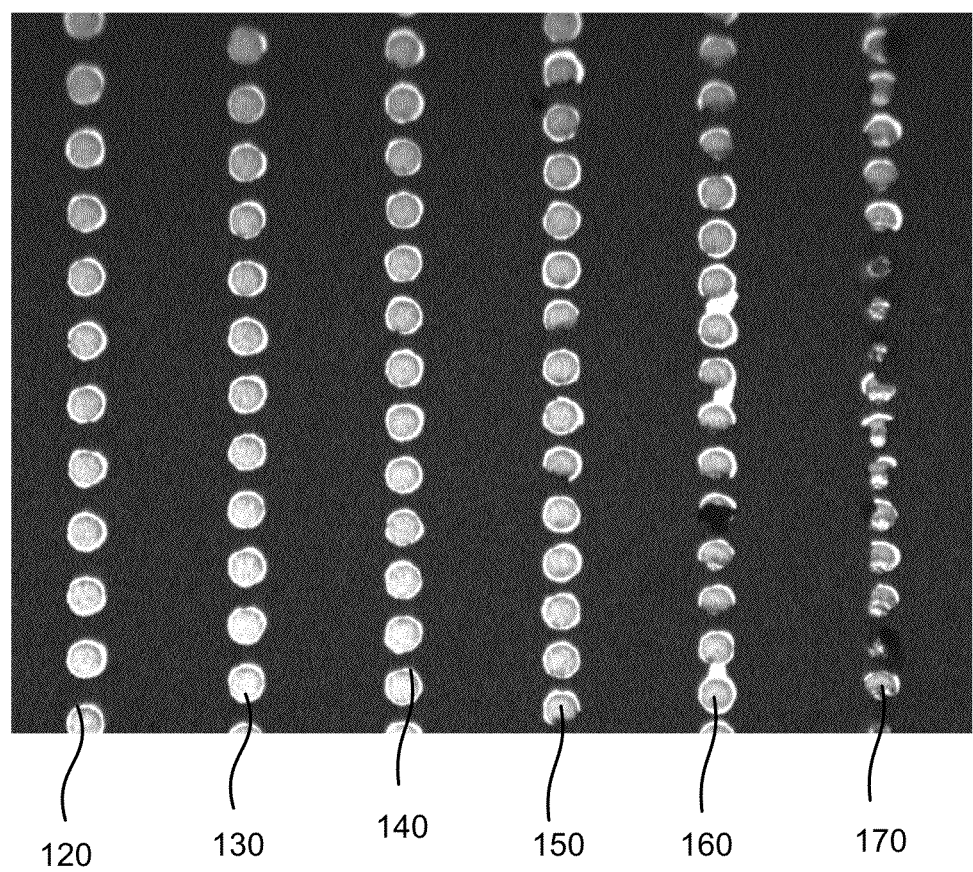
FIG. 1D is an image illustrating a series of vias fabricated using differing via spacings according to an embodiment of the present invention.

FIG. 1D is an image illustrating a series of vias fabricated using differing via spacings according to an embodiment of the present invention. Each discontinuous P2 scribe line 120-170 comprises a series of vias formed in a CIGS layer. Each via is formed by a single laser pulse. From the left to the right, the spacings between adjacent vias in each scribe line decreases. As can be seen in scribe lines 120, 130, and 140, when the spacings between adjacent vias are relatively large, vias with distinct edges are formed. However, as the spacings between adjacent vias decrease to a point that adjacent vias almost overlap as illustrated in scribe lines 150, 160, and 170, vias start to crack and the edges of the vias become poorly defined.

Figure 2A:
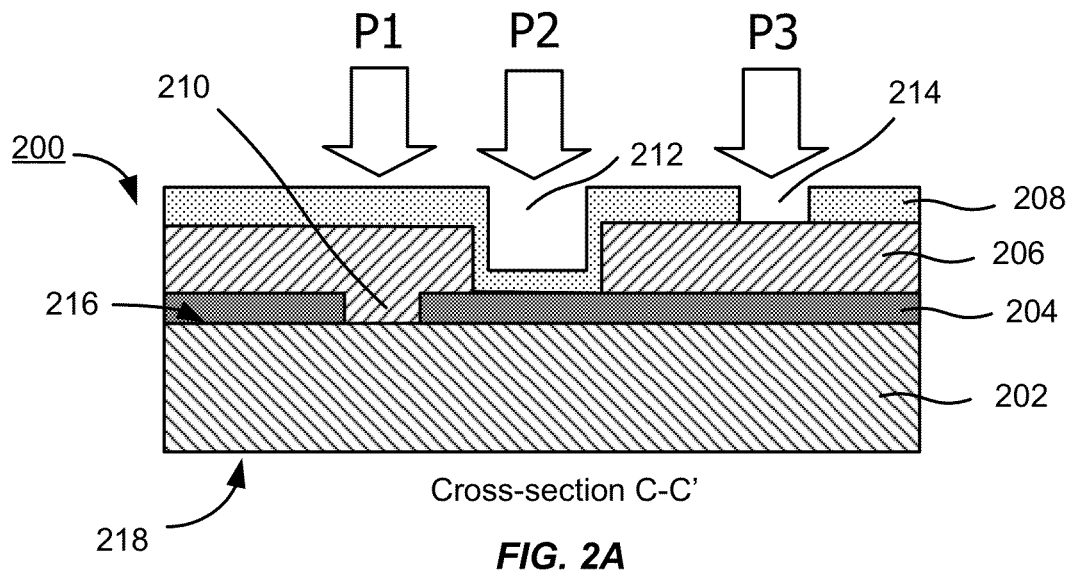
FIG. 2A is a simplified schematic cross-sectional diagram illustrating a thin film PV device according to an embodiment of the present invention.
Figure 2B:
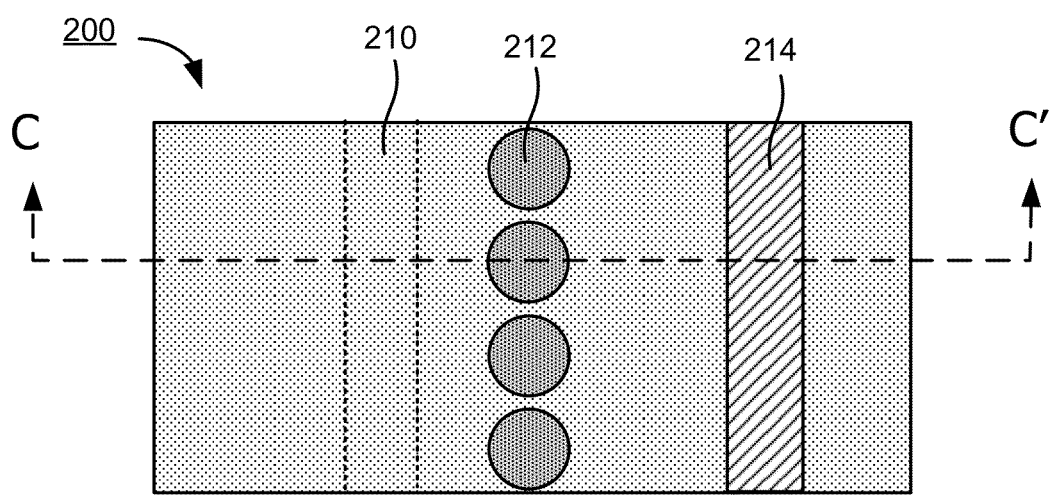
FIG. 2B is a simplified plan view illustrating a thin film PV device according to an embodiment of the present invention.

FIG. 2A is a simplified schematic cross-sectional diagram of a thin film PV device 200, and FIG. 2B is a simplified plan view of the thin film PV device 200 according to an embodiment of the present invention. The PV device 200 comprises a substrate 202 having a first surface 216 and a second surface 218 opposing the first surface 216. The PV device 200 further comprises a first conductive layer 204 coupled to the first surface 216 of the substrate 202. At least one first continuous scribe line 210 is formed in the first conductive layer 204 by P1 laser scribing. The first scribe line 210 extends through a first portion of the first conductive layer 204 to a portion of the first surface 216 of the substrate 204. The PV device 200 further comprises at least one semiconductor layer 206 coupled to remaining portions of the first conductive layer 204 and the portion of the first surface 216 of the substrate 202 that is exposed by the at least one first scribe line 210. A plurality of non-overlapping vias 212 are formed in the at least one semiconductor layer 206 by P2 laser scribing. Each via 212 extends through a respective first portion of the at least one semiconductor layer 206 to a respective second portion of the first conductive layer 204. The PV device 200 further comprises a second conductive layer 208 coupled to a remaining portion of the at least one semiconductor layer 206 and the second portion of the first conductive layer 204 that is exposed by the plurality of vias 212. At least one second continuous scribe line 214 is formed in the second conductive layer 208 by P3 laser scribing. The at least one second continuous scribe line 214 extends through a portion of the second conductive layer 208 to a second portion of the at least one semiconductor layer 206.

According to an embodiment of the present invention, the at least one first continuous scribe line 210 is disposed along a first path, preferably parallel to an edge of the PV device 200; the plurality of non-overlapping vias 212 are disposed along at least one second path substantially parallel to the first path; and the at least one second continuous scribe line 214 is disposed along a third path also substantially parallel to the first path.

The thin film PV device 200 have two important characteristics. First, instead of having a continuous P2 scribe line, the PV device 200 has a discontinuous P2 scribe line in the form of a plurality of non-overlapping vias 212. Each via 212 is formed by a single laser pulse in some embodiments. Second, the thin film PV device 200 has a continuous P3 scribe line that terminates at the interface between the semiconductor layer 206 and the second conductive layer 208, rather than at the interface between the semiconductor layer 206 and the first conductive layer 204 as in conventional CIGS thin film PV modules.

According to an embodiment of the present invention, the semiconductor layer 206 comprises CIGS. As discussed above, even when using laser pulses with tailored pulse shapes, laser scribing of CIGS typically presents issues related to producing satisfactory continuous P2 or P3 scribe lines due to delamination of the CIGS layer 206 from the underlying conductive layer 204. On the other hand, well defined non-overlapping vias 212 can be formed in the CIGS layer 206 as illustrated in FIG. 1D. According to an embodiment, the laser pulse is characterized by a wavelength of about 1064 nm, which corresponds to a photon energy that is approximately equal to the band gap energy of CIGS. Therefore, a significant amount of the light in the laser pulse reaches the interface between the CIGS layer 206 and the first conductive layer 204. As discussed above, the absorption of the laser pulse energy at this interface results in brittle fracture in the overlying CIGS layer, resulting in a well-defined via 212. According to an embodiment, each laser pulse is characterized by a substantially rectangular temporal pulse waveform, with a pulse width ranging from about 2 ns to about 5 ns. According to an embodiment, each laser pulse contains an energy ranging from about 10 µJ to about 20 µJ. In other embodiments, other temporal pulse waveforms and energy ranges are utilized. In some embodiments, light with a wavelength of 1064 nm (photon energy of 1.165 eV) is utilized to perform the methods described herein (particularly the P3 process). In other embodiments, other wavelengths, including doubled 1064 nm light at 532 nm (photon energy of 2.33 eV) is utilized. As described herein, the photon wavelength is of particular interest in relation to the P2 process, in which the wavelength is preferably long enough so that the semiconductor is transparent. One of ordinary skill in the art would recognize many variations, modifications, and alternatives.

Figure 3:
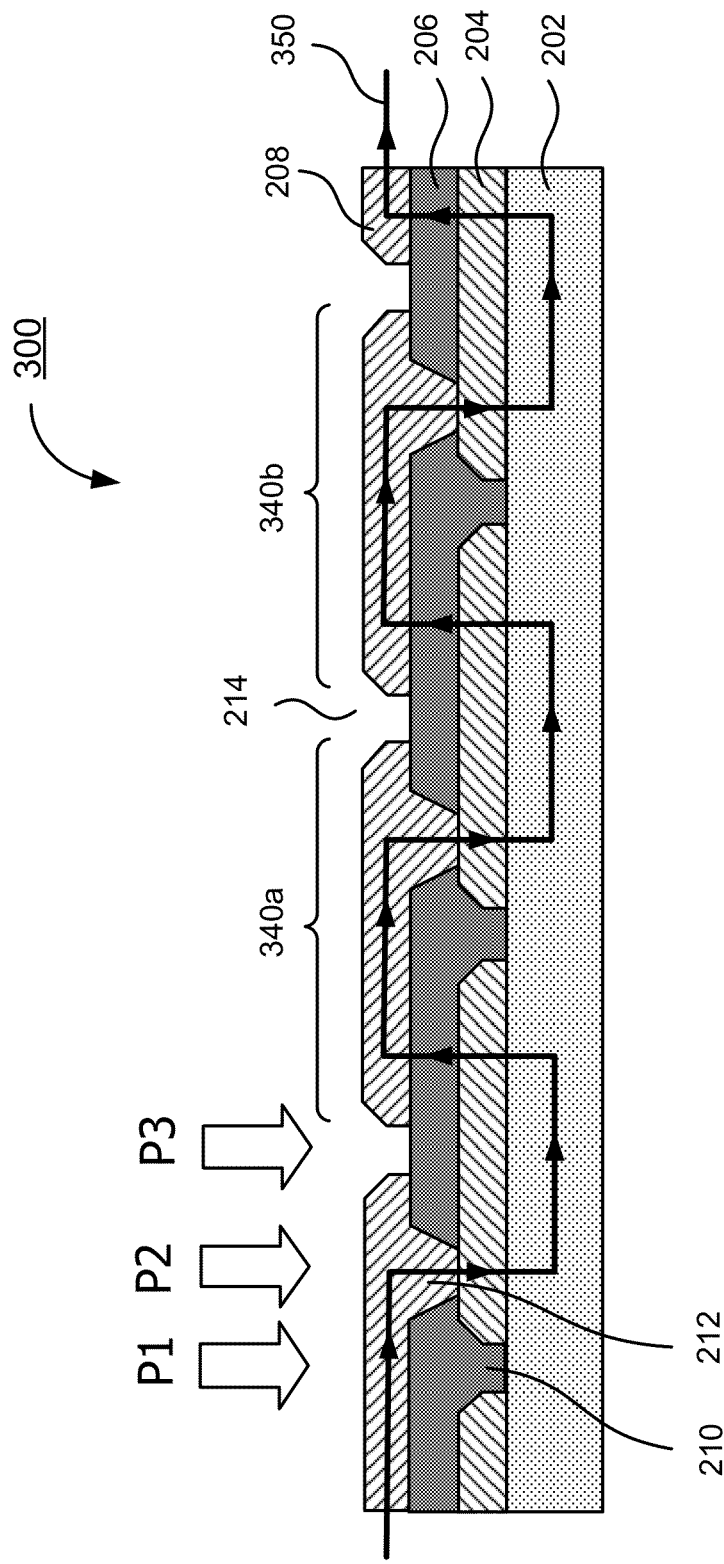
FIG. 3 is a simplified schematic cross-sectional diagram of a photovoltaic (PV) module according to an embodiment of the present invention.

FIG. 3 is a simplified schematic cross-sectional diagram of a thin film PV module 300 similar to the PV device shown in FIGS. 2A and 2B, according to an embodiment of the present invention. The thin film PV module 300 comprises a plurality of PV cells 340a and 340b separated by a plurality of continuous P3 scribe lines 214. The non-overlapping vias 212 formed in the semiconductor layer 206 provide paths for current 350 to flow from the second conductive layer 206 of one cell 340a to the first conductive layer 204 of an adjacent cell 340b. As such, the plurality of PV cells 340 are interconnected to each other in series. This particular electrical structure is not required by embodiments of the present invention and is provided as an example of one method of connecting cells of a thin film PV module.

Figure 4A:
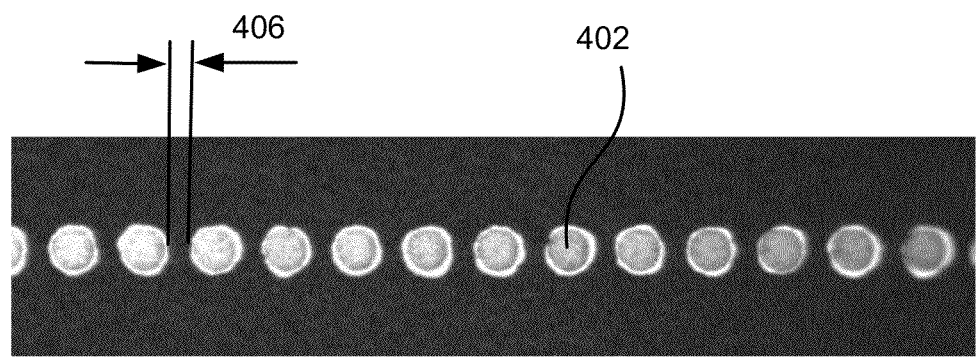
FIG. 4A is an image of a series of circular vias according to an embodiment of the present invention.

FIG. 4A is an image of a series of circular vias 402 formed by P2 laser scribing according to an embodiment of the present invention. The cross-sectional area of each via is defined by the spot area of the laser pulse. According to an embodiment, each laser has a circular spot area with a diameter ranging from about 50 µm to about 75 µm. In other embodiments, other geometries are utilized such as square, rectangular, or the like as described more fully below. According to an embodiment, the spacing 406 between adjacent vias is greater than a radius of each via and less than a diameter of each via.

Figure 4B:
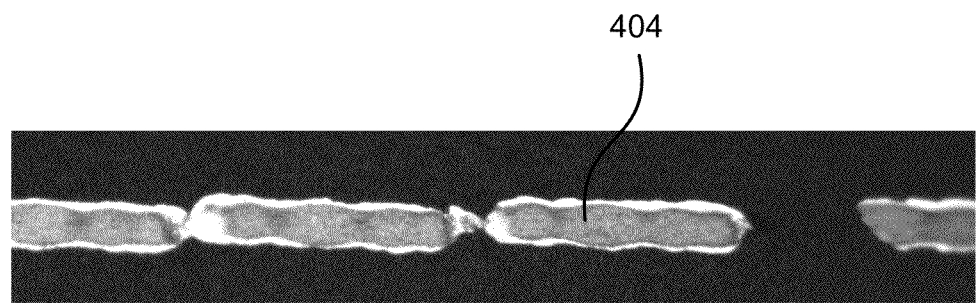
FIG. 4B is an image of a series of elongated vias according to an embodiment of the present invention.

According to other embodiments of the present invention, a discontinuous P2 scribe line may comprise non-circular vias. FIG. 4B is an image of a series of elongated vias 404 formed by P2 laser scribing according to another embodiment of the present invention. Each via 404 is elongated along the path of the P2 scribe line. Each via 404 may be formed by one or more laser pulses.

Since P3 scribe lines 214 separate the plurality of PV cells from each other in a PV module, P3 scribe lines are continuous in the embodiment illustrated in FIG. 3. In a conventional PV module, the same type of laser processing method is often used for both P2 and P3 scribing. However, such P3 laser scribing processes may fail to produce satisfactory scribe lines in CIGS due to delamination of the CIGS layer 206 from the underlying first conductive layer 204 as discussed above. Therefore, according to an embodiment of the present invention, a different type of laser scribing process is used for P3 which forms continuous P3 scribe lines 214 that terminate at the interface between the semiconductor layer 206 and the second conductive layer 208. Since the semiconductor layer 206 has relatively high sheet resistance, such P3 scribe lines 214 are effective in separating the PV cells and the shunt current loss is reduced or minimized.

Figure 5:
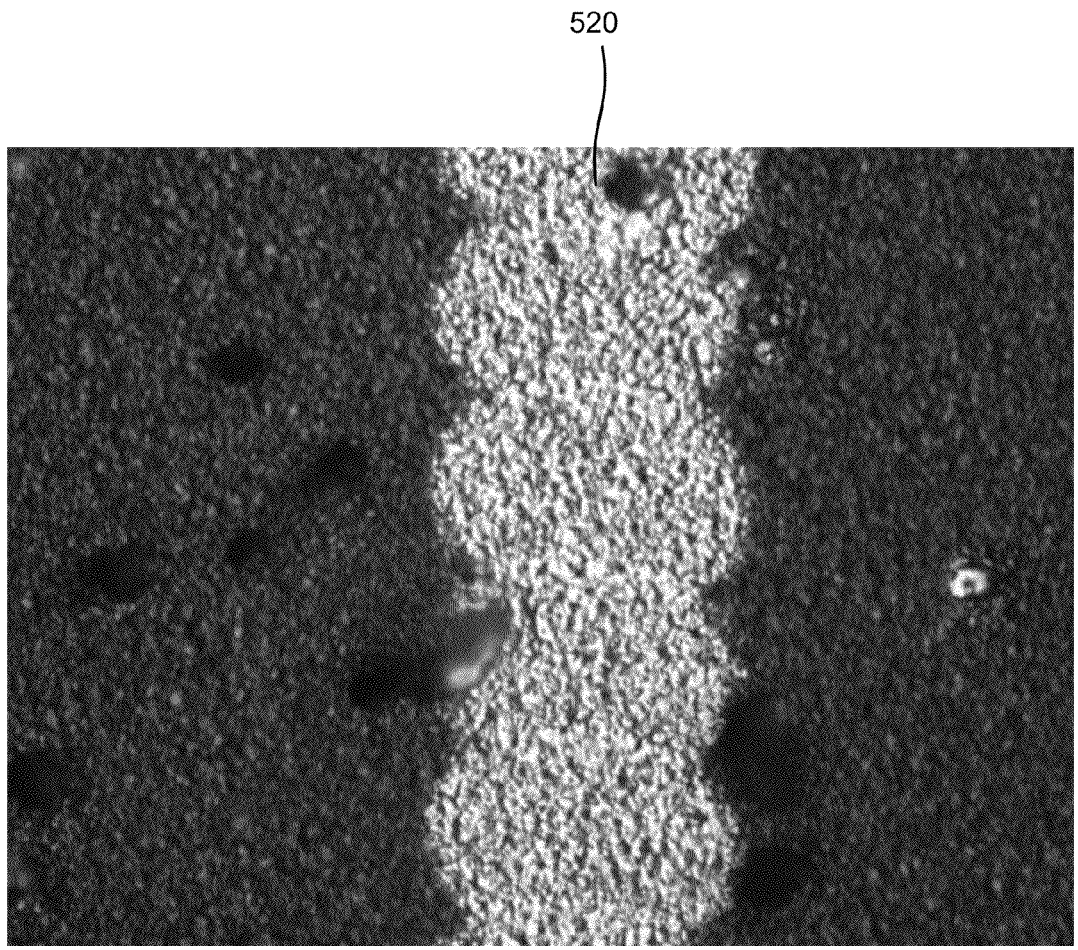
FIG. 5 is an image of a P3 scribe line according to an embodiment of the present invention.

According to an embodiment of the present invention, each continuous P3 scribe line 214 is formed by a series of laser pulses characterized by a wavelength of about 532 nm. Since this wavelength corresponds to a photon energy that is higher than the band gap energy of CIGS, the laser light will not penetrate to a significant depth into the CIGS layer 206 to cause damaging thermal effects in the CIGS layer 206. FIG. 5 is an image of a P3 scribe line 520 (central, light-colored region) formed in a TCO layer (laterally peripheral, dark-colored region) according to an embodiment of the present invention. According to profilometry results for the device illustrated in FIG. 5, P3 scribe lines formed by 532 nm laser pulses do not penetrate into the CIGS layer 206 and the native CIGS surface morphology is preserved. The width of the P3 scribe line is determined by laser spot size. According to an embodiment, the laser beam spot has a diameter ranging from about 25 µm to about 30 µm. Referring to FIG. 5, the conditions utilized to form the illustrated P3 scribe included laser pulses with a substantially rectangular temporal pulse waveform with a pulse width of about 2 ns, a pulse repetition rate of 40 kHz, and a pulse energy of approximately 1.5 µJ. In other embodiments, the laser beam spot size ranges from a diameter of about 10 µm to about 100 µm, a pulse width ranging from about 1 ns to about 25 ns, a pulse repetition rate ranging from about 10 kHz to about 80 kHz, and a pulse energy ranging from about 0.4 to about 24 µJ.

Figure 6:
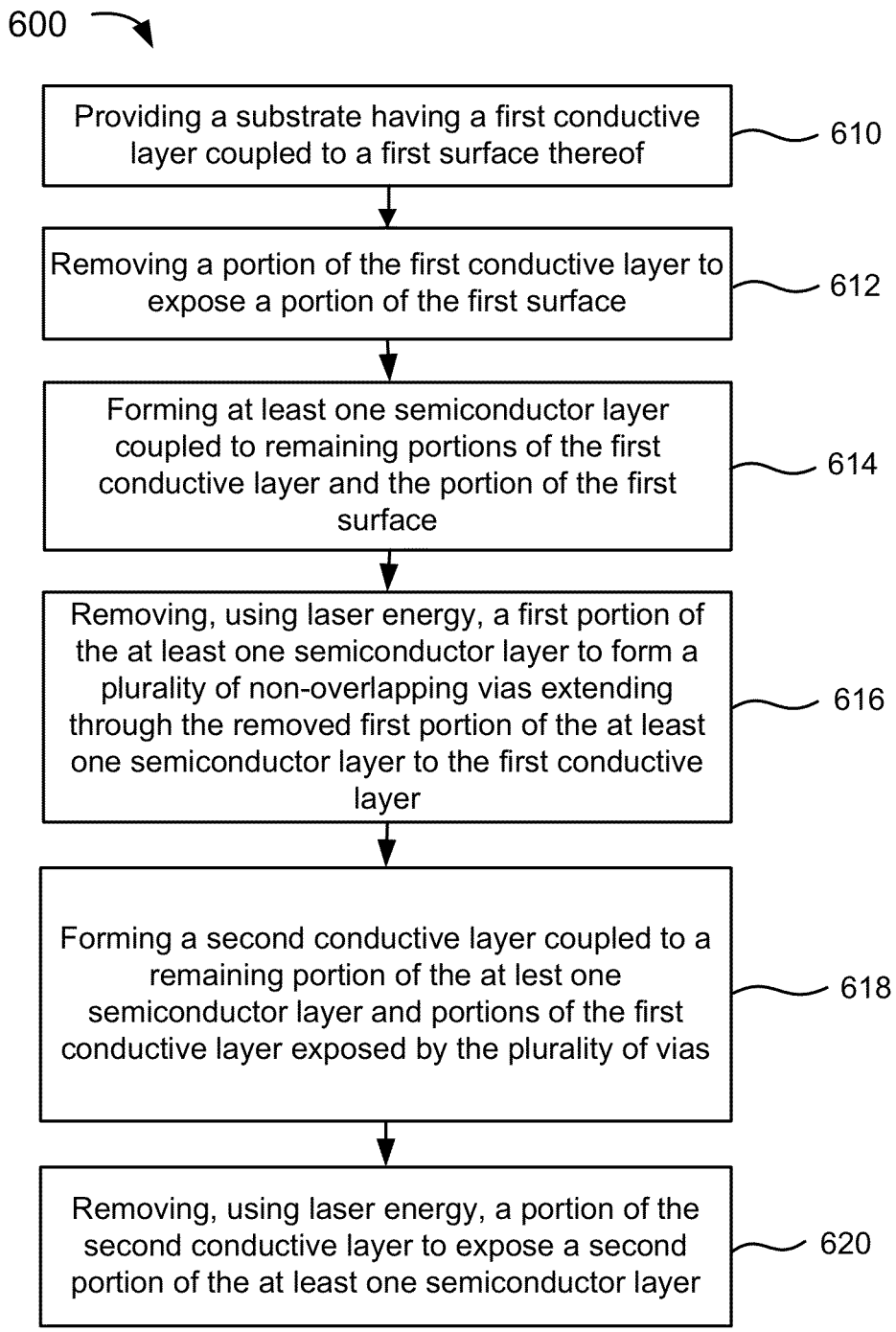
FIG. 6 is a simplified flowchart illustrating a method of forming a thin-film PV device according to an embodiment of the present invention.

FIG. 6 is a simplified flowchart illustrating a method of forming a thin-film PV module according to an embodiment of the present invention. The method 600 includes providing a substrate having a first surface and a second surface opposing the first surface (610). The substrate has a first conductive layer coupled to the first surface. In some embodiments, the substrate may comprise silicon, silicon dioxide, aluminum oxide, sapphire, germanium, gallium arsenide (GaAs), an alloy of silicon and germanium, indium phosphide (InP), glass, plastic, combinations thereof, or the like. In some embodiments, the first surface and the second surface are substantially parallel to each other although this is not required by the present invention. The first conductive layer can include one or more metals such as Mo, Ti, Ni, Al, Au, Cr, Ag, a combination thereof, combinations thereof or the like. Additionally, the first conductive layer can also include a TCO such as ZnO, $SnO_2$, ITO, ATO, AZO, CIO, CZO, GZO, FTO, combinations thereof, or the like.

The method also includes removing a portion of the first conductive layer to expose a portion of the first surface (612) and forming at least one semiconductor layer coupled to remaining portions of the first conductive layer and the portion of the first surface (614). The semiconductor layer 106 may comprise amorphous silicon (a-Si), micro-crystalline silicon (µc-Si), cadmium telluride (CdTe), copper indium diselenide, copper indium gallium diselenide (CIGS), combinations thereof, or the like. According to various embodiments, the semiconductor layer 104 may comprise a single layer of a semiconductor material to form a single junction PV device, or multiple layers of differing semiconductor materials to form a multiple junction PV device.

The method also includes removing, using laser energy, a portion of the at least one semiconductor layer to form a plurality of non-overlapping vias extending through the removed portion of the at least one semiconductor layer to the first conductive layer (616). According to an embodiment, forming each of the plurality of non-overlapping vias comprises ablating a portion of the at least one semiconductor layer using a single laser pulse. In other embodiments, multiple laser pulses are utilized to form each of the non-overlapping vias.

The method additionally includes forming a second conductive layer coupled to a remaining portion of the at least one semiconductor layer and portions of the first conductive layer exposed by the plurality of vias (618). According to an embodiment, the second conductive layer comprises a TCO, such as ZnO, $SnO_2$, ITO, ATO, AZO, CIO, CZO, GZO, FTO, combinations thereof, or the like. The method includes removing, using laser energy, a portion of the second conductive layer to expose a second portion of the at least one semiconductor layer (620).

According to an embodiment, the plurality of non-overlapping vias are disposed along a first path; and the second portion of the at least one semiconductor layer is disposed along a second path substantially parallel to a first path. Each of the plurality of non-overlapping vias can be characterized by a predetermined cross-sectional area and a spacing between adjacent vias that is greater than a first dimension of the cross-sectional area and less than a second dimension of the cross-sectional area. As an example, the predetermined cross-sectional area can be a circle and the first dimension of the cross-sectional area can be a radius of the circle and the second dimension of the cross-sectional area can be a diameter of the circle. In other embodiments, the plurality of non-overlapping vias are characterized by a predetermined cross-sectional area that is elongated as illustrated in FIG. 4B.

It should be appreciated that the specific steps illustrated in FIG. 6 provide a particular method of forming a thin-film PV module according to an embodiment of the present invention. Other sequences of steps may also be performed according to alternative embodiments. For example, alternative embodiments of the present invention may perform the steps outlined above in a different order. Moreover, the individual steps illustrated in FIG. 6 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 7:
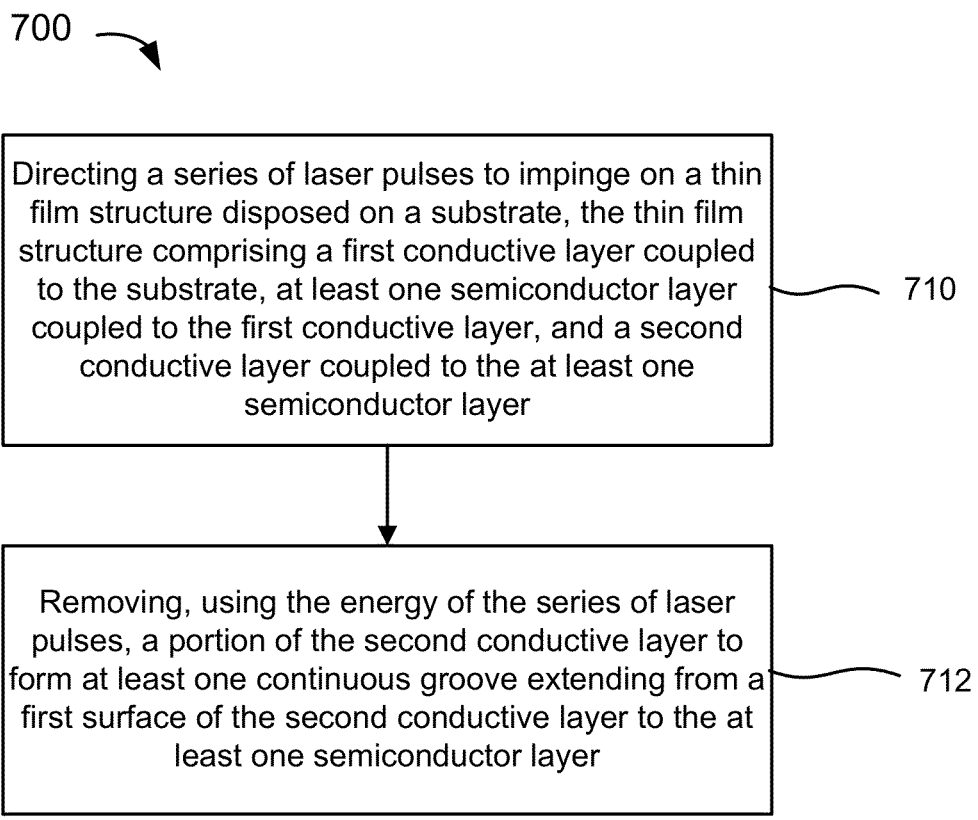
FIG. 7 is a simplified flowchart illustrating a method of P3 laser scribing process according to an embodiment of the present invention.

FIG. 7 is a simplified flowchart illustrating a method of scribing a pattern in a thin film structure disposed on a substrate according to an embodiment of the present invention. The thin film structure comprises a first conductive layer coupled to the substrate, at least one semiconductor layer coupled to the first conductive layer, and a second conductive layer coupled to the at least one semiconductor layer. The method 700 includes directing a series of laser pulses to impinge on the thin film structure (710). The series of laser pulses is characterized by a photon energy greater than a band gap energy associated with at least one layer of the at least one semiconductor layer. The method also includes removing, using the energy of the series of laser pulses, a portion of the second conductive layer to form at least one continuous groove extending from a first surface of the second conductive layer to the at least one semiconductor layer (712). In an embodiment, the at least one continuous groove does not substantially extend into the at least one semiconductor layer.

According to an embodiment, directing the series of laser pulses to impinge on the thin film structure comprises irradiating the first surface of the second conductive layer. As an example, the at least one semiconductor layer can include copper indium gallium diselenide or copper indium diselenide and the photon energy can be about 1.165 eV.

The second conductive layer can include one of several materials, for example, a TCO such as ZnO, $SnO_2$, ITO, ATO, AZO, CIO, CZO, GZO, FTO, combinations thereof, or the like.

It should be appreciated that the specific steps illustrated in FIG. 7 provide a particular method of scribing a pattern in a thin film structure according to an embodiment of the present invention. Other sequences of steps may also be performed according to alternative embodiments. For example, alternative embodiments of the present invention may perform the steps outlined above in a different order. Moreover, the individual steps illustrated in FIG. 7 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 8:
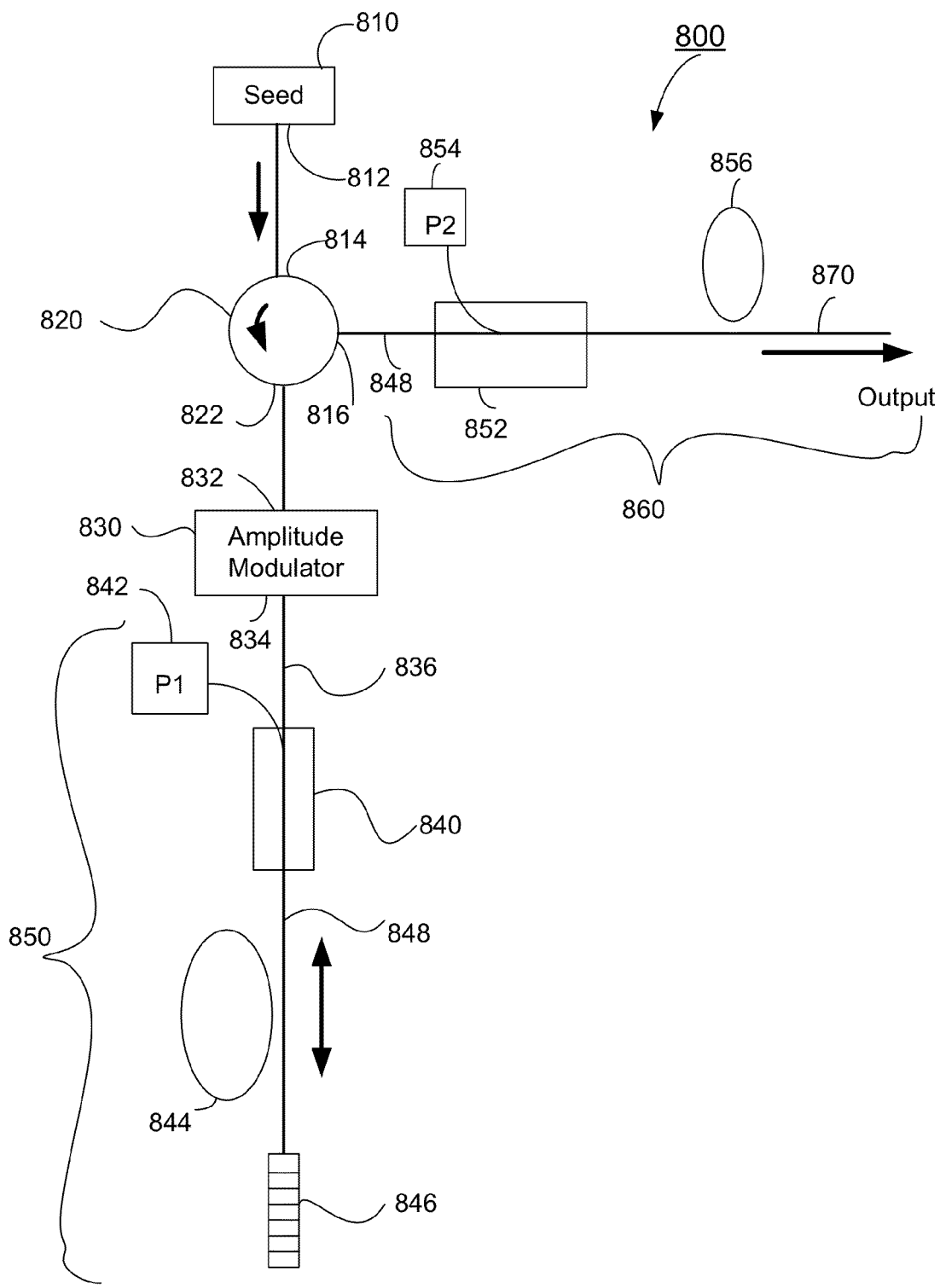
FIG. 8 is a simplified schematic diagram illustrating a laser suitable for P2 and P3 laser scribing processes according to an embodiment of the present invention.

With reference to FIG. 8, in an embodiment of the present invention, a pulsed laser source 800 generating bursts of pulses of predetermined pulse shape is provided. U.S. Pat. No. 7,428,253 titled "Method and System for Pulsed Laser Source with Shaped Optical Waveforms" issued Sep. 27, 2008 describes examples of tunable pulsed laser sources and is hereby incorporated by reference in its entirety. In addition, U.S. patent application Ser. No. 12/210,028 titled "Method and system for a Pulsed Laser Source Emitting Shaped Optical Waveforms" filed Sep. 12, 2008, also describes examples of tunable pulsed laser sources and is hereby incorporated by reference in its entirety. The pulsed laser source 800 includes a seed source 810 adapted to generate a seed signal and an optical circulator 820 having a first port 814 coupled to the seed source, a second port 822, and a third port 816. The pulsed laser source 800 also includes an amplitude modulator 830 characterized by a first side 832 coupled to the second port 822 of the optical circulator and a second side 834. The pulsed laser source 800 further includes a first optical amplifier 850 characterized by an input end 836 and a reflective end 846. The input end is coupled to the second side 834 of the amplitude modulator. Moreover, the pulsed laser source 800 includes a second optical amplifier 860 coupled to the third port 816 of the optical circulator 820. Although FIG. 8 illustrates the use of one optical amplifier 860 coupled to the third port of the optical circulator 820, this is not required by some embodiments of the invention. In alternative embodiments, multiple optical amplifiers are utilized downstream of the optical circulator as appropriate to the particular applications.

Figure 9:
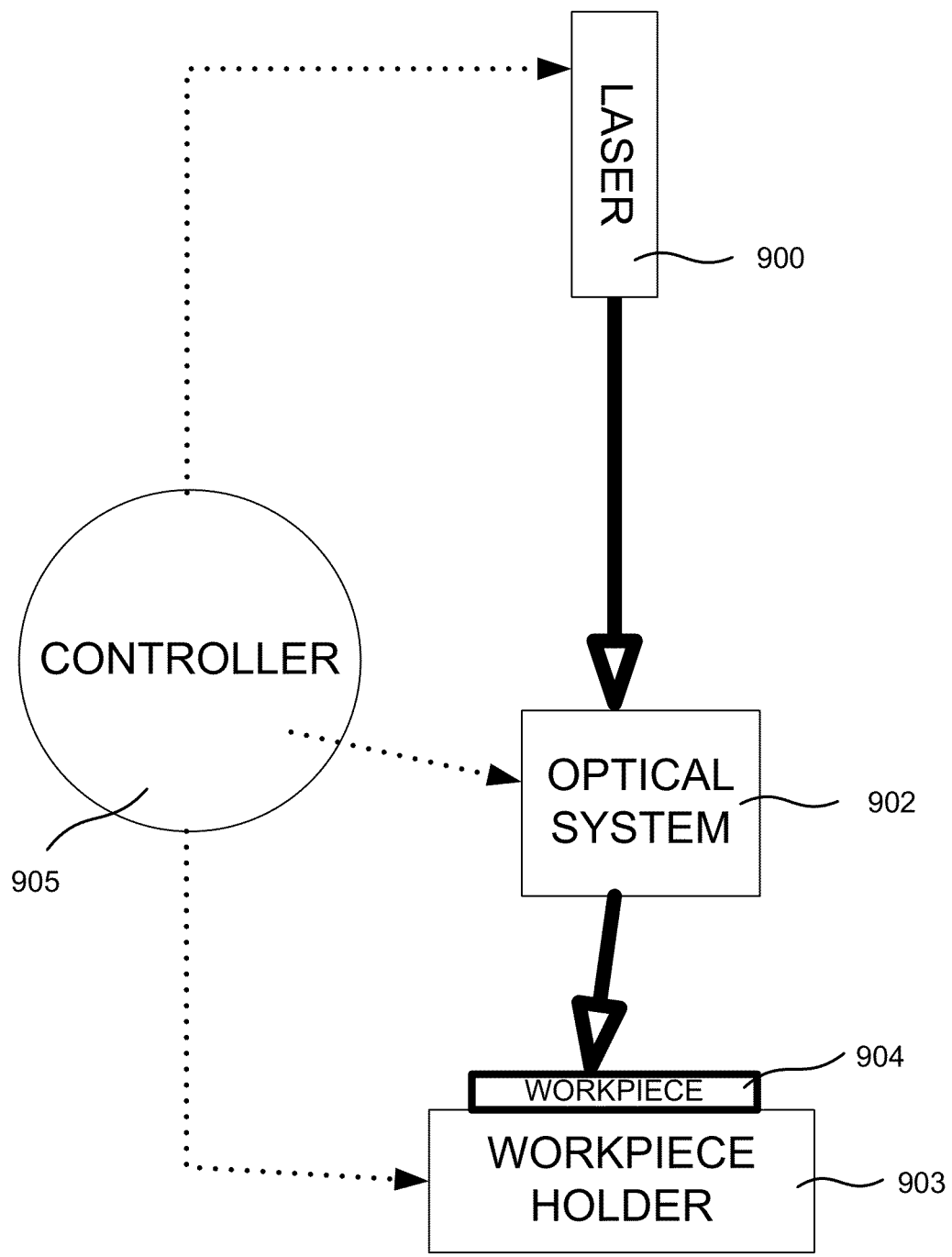
FIG. 9 is a simplified schematic diagram of a laser processing system according to an embodiment of the present invention.

FIG. 9 shows an exemplary laser processing system capable of scribing a line in a thin film material workpiece 904 using a laser generating a series of pulses with predetermined pulse shape, according to an embodiment of the present invention. The system includes a laser source 900, an optical system 902, a controller 905, and a workpiece 904 that is positioned on top of a workpiece holder 903. The laser source 900 provides laser pulses with certain characteristics, such as wavelength, pulse length, pulse shape, and pulse repetition rate. The wavelength, pulse length, and pulse shape may be adjusted according to embodiments of the present invention to scribe a line in a thin film material workpiece using a series of pulses with predetermined pulse shape.

The optical system may include lenses and mirrors for focusing a laser beam on the workpiece, and a component for directing the beam to various positions on the workpiece. In a specific embodiment, the component for directing the beam may be mirrors mounted on galvanometers. The controller may be used to control the optical system and the motion of the component for directing beam. For example, when scribing a line in a thin film workpiece 904, the optical system 902 may be controlled by the controller to scan the beam in a line along the surface of the workpiece such that each focused laser spot is directed to a location adjacent to the previous focused laser spot but with an overlap. In another embodiment, the optical system may focus the laser beam at the surface of the workpiece and the workpiece holder may be controlled by the controller to move the workpiece in a line such that each focused laser pulse impinges on a location adjacent to the previous focused laser pulse in the series of laser pulses but with some spot overlap.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of forming a thin film photovoltaic module, the method comprising:
    providing a substrate having a first surface and a second surface opposing the first surface, wherein the substrate has a first conductive layer coupled to the first surface;
    removing a portion of the first conductive layer to expose a portion of the first surface;
    forming at least one semiconductor layer coupled to remaining portions of the first conductive layer and the portion of the first surface;
    removing, using laser energy, a first portion of the at least one semiconductor layer to form a plurality of non-overlapping vias extending through the removed first portion of the at least one semiconductor layer to the first conductive layer, using a single laser pulse per via;
    forming a second conductive layer coupled to a remaining portion of the at least one semiconductor layer and portions of the first conductive layer exposed by the plurality of vias; and
    removing, using laser energy, a portion of the second conductive layer to expose a second portion of the at least one semiconductor layer.

2. The method of claim 1 wherein:
    the plurality of non-overlapping vias are disposed along a first path; and
    the second portion of the at least one semiconductor layer is disposed along a second path substantially parallel to the first path.

3. The method of claim 1 wherein the at least one semiconductor layer comprises copper indium gallium diselenide.

4. The method of claim 1 wherein the at least one semiconductor layer comprises at least one of amorphous silicon, cadmium telluride, or copper indium diselenide.

5. The method of claim 1 wherein each of the plurality of non-overlapping vias is characterized by a predetermined cross-sectional area and a spacing between adjacent vias is greater than a first dimension of the cross-sectional area and less than a second dimension of the cross-sectional area.

6. The method of claim 5 wherein:
    the predetermined cross-sectional area comprises a circle;
    the first dimension of the cross-sectional area is a radius of the circle; and
    the second dimension of the cross-sectional area is a diameter of the circle.

7. The method of claim 2 wherein each of the plurality of non-overlapping vias are characterized by a predetermined cross-sectional area that is elongated in a direction of the second path.

* * * * *